United States Patent [19]

Murdoch

[11] Patent Number: 4,858,180

[45] Date of Patent: Aug. 15, 1989

[54] CONTENT ADDRESSABLE MEMORY AND SELF-BLOCKING DRIVER

[75] Inventor: Robert Murdoch, Sacramento, Calif.

[73] Assignee: Data General Corporation, Westboro, Mass.

[21] Appl. No.: 835,107

[22] Filed: Feb. 28, 1986

[51] Int. Cl.[4] .......................... G06F 1/00; G11C 15/00; H03K 5/153

[52] U.S. Cl. ...................................... 365/49; 364/900; 307/358

[58] Field of Search .................. 365/49, 189; 364/400, 364/200, 900; 307/530, 358

[56] References Cited

U.S. PATENT DOCUMENTS

| 4,009,472 | 2/1977 | Jones | 365/49 |
| 4,532,606 | 7/1985 | Phelps | 365/49 |
| 4,622,653 | 11/1980 | McElroy | 365/230 |
| 4,670,858 | 6/1987 | Almy | 365/49 |

Primary Examiner—Terrell W. Fears
Assistant Examiner—Melissa J. Koval
Attorney, Agent, or Firm—Limbach, Limbach & Sutton

[57] ABSTRACT

An improved content addressable memory cell which employs a structure which utilizes a single transistor to discharge the hit line, and is driven by a self-blocking driver which glitchlessly changes state without the use of virtual nodes. Also disclosed is an alternative content addressable memory cell which can be written into in two distinct fashions, one of which permits the content of the cell to be changed without requiring the entire data word with which the cell is associated to be rewritten.

13 Claims, 2 Drawing Sheets

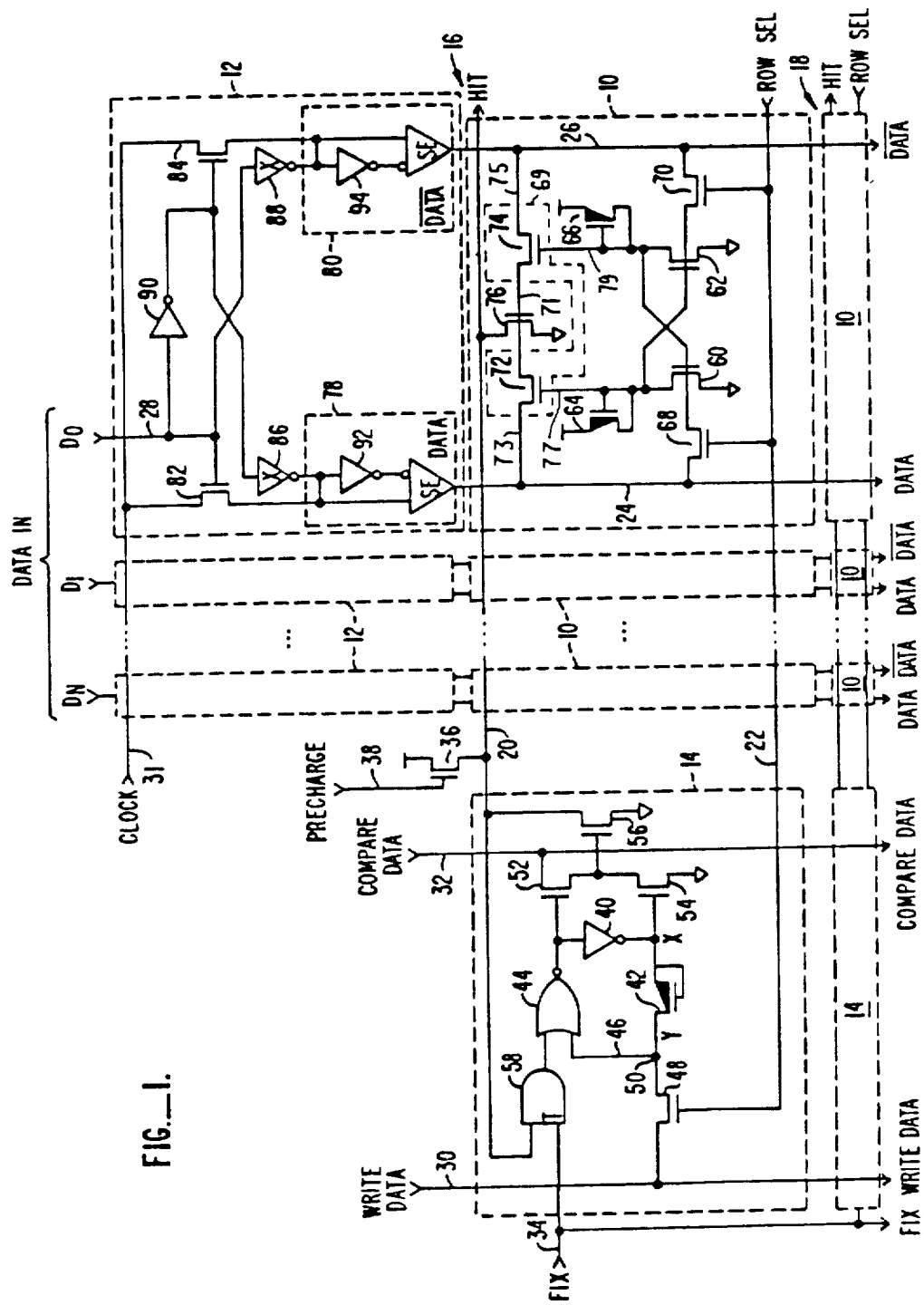
FIG._1.

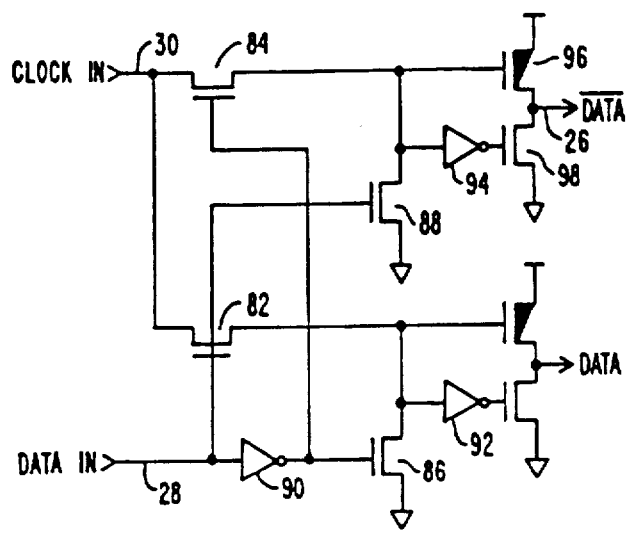
FIG._2.
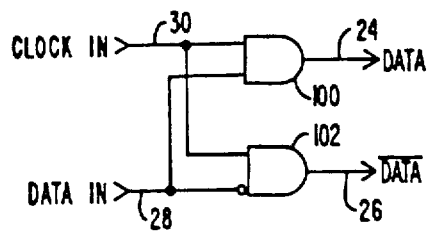
FIG._3.
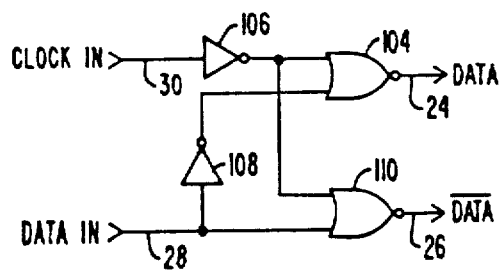
FIG._4.

CONTENT ADDRESSABLE MEMORY AND SELF-BLOCKING DRIVER

TECHNICAL FIELD

The present invention relates generally to electronic memory and more specifically to a content addressable memory with self-blocking driver.

BACKGROUND ART

Content addressable memories are well known in the art. These memories provide the function of comparing data applied to the memory with data already stored in the memory and providing an indication as to whether or not the applied data is the same as the stored data. Such functions find application in large memory systems to identify the locations of blocks of data or programs. As is often the case with design efforts in large scale integrated circuits (LSI) and very large scale integrated circuits (VLSI) there is an ongoing effort to reduce the number of components, and thus the physical area required to implement a particular function. It is also another goal in such design to increase the speed with which the circuitry responds. Thus, there is a continuing effort to provide the subject functions in a smaller area and with faster response than that which is present in the prior art. Among the problems associated with driving the data input lines of a content addressable memory, and in fact in connection with the driving of any input lines which are associated with precharged lines, is that glitches or small disturbances are sometimes present on the output line during the transition of the driver from its quiescence state to its asserted state. These glitches or other disturbances do not accurately reflect the steady state logic state of the driver circuit. This can frustrate any attempts to precharge circuits which are being driven by the self-blocking driver in that the glitches or disturbances may cause the premature discharging of the precharged lines.

SUMMARY OF THE INVENTION

These and other problems of previous content addressable memory cells are overcome by the present invention of an improved content addressable memory cell which is responsive to data applied to complementary data-in lines, to compare the applied data to previously stored data, and to provide an indication on a hit line of whether the applied data matches the previously stored data. The improvement comprises transistor means responsive to a control signal and coupled to the hit line for placing the hit line in a predetermined logic state in response to the control signal. Means are provided which are responsive to the logic state of the previously stored data for selectively supplying, as the control signal to the transistor means, the logic state from one of the complementary data-in lines. The complementary data-in line is selected in accordance with the logic state of the previously stored data. This results in the placing of the hit line in the predetermined logic state when there is a mismatch between the applied data and the previously stored data. This structure permits the content addressable memory cell to respond to a mismatch between the applied data and the stored data at a significantly higher rate that in previous content addressable memory cells.

The self-blocking driver of the present invention employs means which uncontrollably route the clock signal to either an uncomplemented output driver means or a complemented output driver means. Means are also provided which cause the other output drive means to which the clock signal was not supplied to be placed in a predetermined logic state. The data input logic state is utilized to control this routing of the clock signal. Thus, when the clock signal makes its transition from a logic zero state to a logic one state, i.e., a clock asserted state, only the output drive means to which the clock signal is being supplied responds to the transition. The other output drive means, being disabled, does not respond at all. Thus, there are no glitches or other disturbances at the output of the disabled output drive means.

This structure has an added advantage of having a fast response. In the typical driver used in a precharge block environment, a virtual ground node is typically used. Such a virtual ground node is absent in the self-blocking driver of the present invention. As such, the capacitance, and thus the slower response, typically associated with the virtual ground node is not present in the self-blocking driver configuration of the present invention.

Also included is a self-blocking driver for applying the data to the complementary data-in lines. The self-blocking driver is responsive to a clock signal and to the data signal. The self-blocking driver maintains the signal applied to the complementary data-in lines at a predetermined logic state while the clock signal is in a logic zero state, and then permits only the data output line which is to provide a logic state different from the first predetermined logic state to change its logic state.

Also provided is another implementation of a content addressable memory which provides two modes for changing the logic state stored therein, one by way of a conventional write enable and write data technique, and the other by utilizing the logic state of the hit line and a fix data command. In this manner, when the content addressable memory cell is utilized in a bank of such cells, the logic state stored in a particular cell can be changed independently of any write data operation. In the content addressable memory cell of the present invention, a memory element utilizing feedback is used and logic means are provided in the feedback path to set the logic state stored in the memory element to a predetermined condition when the hit line and the fix data line are at a predetermined logic state. The logic state of the memory element is utilized to drive a two high stack of transistors which compared data line. The junction of the two high stack of transistors is coupled to the gate terminal of a third transistor which drives the hit line to a logic zero state when the logic state of the compared data line and the stored data match.

It is therefore an object of the present invention to provide improved content addressable memory cells and self-blocking drivers therefor.

It is another object of the present invention to provide improved content addressable memory cells which require fewer elements to implement.

It is a further object of the present invention to provide a content addressable memory cell which can be written in a number of alternate ways.

It is another object of the present invention to provide a self-blocking driver which provides an inverted and noninverted output, and further wherein glitches and other disturbances are absent on the output lines during the transition of the driver between logic states.

These and other objectives, features and advantages of the present invention will be more readily understood upon considering the following detailed description of certain embodiments of the present invention and the accompanying drawings.

BRIEF DESCRIPTION OF THE DRAWINGS

FIG. 1 is a simplified schematic representation of the present invention.

FIG. 2 is a more detailed schematic representation of the self-blocking driver of the present invention.

FIG. 3 is a logical representation of the self-blocking driver of the present invention.

FIG. 4 is a alternative logical representation of the self-blocking driver of the present invention.

DETAILED DESCRIPTION OF THE INVENTION

Referring to FIG. 1, there is shown a content addressable memory cell 10 which is driven from a self-blocking driver 12, as well as an alternative configuration 14 of a content addressable memory which provides two schemes for changing the logic state of the stored data.

FIG. 1 illustrates a content addressable memory which is formed of a plurality of self-blocking drivers 12, content addressable memory cells 10, and alternative content addressable memory cells 14. N content addressable memory cells 10 are arranged to form a row 16 of the content addressable memory structures. Associated with each of the content addressable memory cells 10 in row 16 is a self-blocking driver 12.

It is to be understood that the content addressable memory structure of FIG. 1 includes a number of rows, row 16 and 18 of which are shown in the Figure. Each row of content addressable memory cells 10 also includes an alternate content addressable memory cell 14. A hit line 20 is routed through each of the content address memory cells 10 and through alternate content a memory cell 14 in each of the rows of the content addressable memory structure. Also routed through all of the cells is a row select line 22. Each of the content addressable memory cells 10 receives a noninverted, or uncomplemented, data input from its associated self-blocking driver 12, as well as an inverted, or complimented, data input.

It is to be noted that the inverted and noninverted data signals are supplied by the self-blocking driver 12 to an associated content addressable cell 10 in each of the rows of the content addressable memory structure, on lines 24 and 26, respectively, so as to define a column of content addressable memory cells 10. In other words, the content addressable memory structure of FIG. 1 defines N columns of content addressable memory cells 10, wherein each column is driven by an associated self-blocking driver 12.

Each self-blocking driver circuit 12 receives an associated data input, for example $D_0$ on line 28, and receives, in common, a clock signal on line 31.

Each alternative content addressable memory cell 14 receives write data on line 30, compare data on line 32, and a fix command on line 34.

Hit line 20 is connected to transistor 36, which in turn is controlled by a precharge signal on line 38. The presence of a precharge signal on line 38 causes transistor 36 to be operated so as to precharge hit line 20.

In operation, the self-blocking driver 12 drives the data onto the inputs of content addressable memory cell 10. The self-blocking driver 12 initially drives invalid but benign data onto the inputs of content addressable memory cell 10 and then glitchlessly changes to driving a valid data after a predetermined point in time.

In general, the self-blocking driver is especially useful with dynamic structures that require precharging during a certain portion of clock cycle. For example in conjunction with the content addressable memory cell 10, such cell is precharged while the clock signal, for example on line 31 is in a low state. When the clock signal changes to a high state, the data is evaluated by content addressable memory cell 10.

In the past, the blocking structures utilized to permit the precharging and then the presentation of data to a dynamic structure, employed a virtual ground node. Such a structure was costly both in terms of speed as well as component count, the virtual ground node in the classic approach usually has a very large capacitance associated with it, as well as the requirement for a very large blocking transistor. Due to the size of the node capacitance and the blocking transistor, significant delays resulted from the charging and discharging of the virtual ground node, and substantial current levels were required for driving the blocking device.

The structure of the present invention shown generally as self-blocking driver 12, provides all of the advantages of the classical precharged-block scheme, but substantially eliminates the cost of dealing with a virtual ground node.

In operation, the content addressable memory cell 10 compares the data previously written to it with data being applied on the column lines, lines 24 and 26. If the data on the column lines does not match the data in the cell, hit line 20 is pulled down. If there is a match of the data, hit line 20 is unaffected. The structure of the present invention of a content addressable memory cell permits the use of a single pull-down device resulting in a faster response than in previous content addressable memory cell structures.

In operation, the alternative content addressable memory cell 14 compares the data previously written to it with data applied to the compare data line 32 the data on the compare data line 32 is of a particular logic state, and the data stored within the alternate content addressable memory cell 14 is of a different logic state, the cell pulls down hit line 20. If the data applied matches the data stored, hit line 20 is unaffected. Further, if the six line 34 is pulsed at a predetermined logic state while the hit line 20 is at a predetermined logic state, the content of alternative content addressable memory cell 14 will predetermined logic state even though the write data line 30 is not asserted. Thus, the alternative content addressable memory cell 14 can be selected for writing by the hit line 20 and the fix line 34 independently of the write line and the normal write addressing mechanism, i.e., by way of row select line 22.

Alternative Content Addressable Memory Cell 14

Referring more particularly to the bottom left-hand corner of FIG. 1, alternative content addressable memory cell 14 will be described in greater detail.

The memory element of the cell utilizes a feedback path to maintain the state of the data. The cell includes inverter 40, soft depletion transistor 42, used to raise the impedance from node X to node Y and NOR gate 44. The output of NOR gate 44 is coupled to the input of inverter 40. The output of inverter 40 is coupled to the source of soft depletion transistor 42. The gate terminal of soft depletion transistor 42 is connected to its source terminal so that it provides a feedback path with a higher impedance than the device 48 when it is turned on. In other words, the soft depletion transistor 42 is connected to provide an impedance rise from node X to node Y which is greater than the effective source impedance for the data signal as supplied through transistor 48. The drain of soft depletion transistor 42 is coupled to the input of NOR gate 44 via line 46. In such a configuration, the logic state at the drain of soft depletion transistor 42 represents the logic state of the memory element. NOR gate 44 provides at its output the inverse of this logic state. In turn, inverter 40 inverts the output of NOR gate 44 to apply the original logic state to the source and gate of soft depletion transistor 42. This, in turn, causes the drain of soft depletion transistor 42 to be maintained at the original logic state.

The logic state of the memory element can be changed easily because the logic state of the memory cell is specified as that present at the junction of the drain of soft depletion transistor 42 and the input to NOR gate 44. The logic state can be changed by way of transistor 48 which is coupled between write data line 30 and the junction of line 46 and the drain terminal of soft depletion transistor 42. The gate terminal of transistor 48 is tied to row select line 22. When row select line 22 is asserted, the logic state present on write data line 30 is coupled to the junction of line 46 and the drain terminal of soft depletion transistor 42. Because transistor 42 is of the soft depletion type the logic state of node 50 can be forced to a different logic state by a signal from transistor 48. In turn, this causes the output of NOR gate 44 to change and thus the application of a different logic state by inverter 40 to the source and gate terminal of soft depletion transistor 42. In turn this maintains the memory element in its new logic state.

For example, if the logic state being stored in the memory element was a logic one, junction 50 would be at a logic one state, the output of NOR gate 44 would be at a logic zero, and the output of inverter 40 would be at a logic one state. Assuming that a logic zero is present on the write data line 30, and that row select line 22 is asserted, a logic zero will be coupled to node 50 by way of transistor 48. This logic zero at node 50 will cause the output of NOR gate 44 to change to a logic one, and in turn, cause the output of inverter 40 to change to a logic zero. This logic zero will be coupled through soft depletion transistor 42 back to node 50 to maintain 50 at a logic zero condition after transistor 48 is turned off by the removal of the row select signal from row select line 22.

In effect, NOR gate 44 in the scenario described above acts as an inverter. Thus, if NOR gate 44 were replaced by an inverter, the resulting structure would provide a memory element which would be written by way of the write data line 30 and the row select line 22.

The content addressable feature of alternative content addressable memory cell 14 is provided by way of compare data line 32 and transistors 52, 54 and 56. The source terminal of transistor 52 is coupled to compare data line 32. The gate terminal of transistor 52 is coupled to the output of NOR gate 44. The drain terminal of transistor 52 is coupled to the source terminal of transistor 54 and to the gate terminal of transistor 56. The gate terminal of transistor 54 is coupled to the output of inverter 40. The drain terminal of transistor 54 is coupled to the signal common of the content addressable memory structure of FIG. 1. Finally, the drain terminal of transistor 56 is coupled to the signal common of the content addressable memory structure of FIG. 1, and the source terminal of transistor 56 is coupled to the hit line 20.

In operation, transistors 52 and 54 act as comparators to compare the logic state present on the compare data line 32 to the logic state stored in the memory element. Transistor 56 acts to drive an indication of a mismatch onto hit line 20. In the present configuration, a mismatch will be indicated when a logic one state is present on compare data line 32 and a logic zero state is stored in the memory element. In such a case, the output of NOR gate 44 will be a logic one, thus activating transistor 52. The logic one state of compare data line 32 will be coupled to the gate terminal of transistor 56, thus causing transistor 56 to couple hit line 20 to ground. Further, the output of inverter 40 will be at a logic zero state, thus maintaining transistor 54 in an off condition.

For all other logic states of the compare data line 32 and the stored logic state in the memory element, either transistor 54 will be turned on so as to maintain transistor 56 in an off condition, or the logic state coupled by transistor 52 to the gate terminal of transistor 56 will prevent transistor 56 from being turned on. Thus, it can be seen that the alternative content addressable memory structure 14 will pull down hit line 20 when compare data line 32 is at a logic one state and a logic zero state is being stored in the memory element.

It is to be understood that the configurations of transistors 52, 54 and 56 can be changed to provide different responses, as desired, in the comparison of data applied to the compare data line 32 with the logic state stored in the memory element, within the scope of the present invention.

In accordance with the present invention, there is provided a further ability to write data into the alternative content addressable memory structure 14 through other than the use of the write data line 30 and the row select line 22. This is provided by way of NOR gate 44, and gate 58, hit line 20, and fix line 34. As discussed above, in the general memory element structure, NOR gate 44 provides an inversion function. However, in accordance with the present invention, the other input of NOR gate 44 is coupled to the output of AND gate 58. In turn, AND gate 58 receives at its inputs, the logic state of the hit line 20, and the signal provided on fix line 34. In such a configuration, NOR gate 44 permits the logic states of hit line 20 and fix line 34 to change the logic state of the memory element when such logic state is a logic zero.

Thus, when a logic one is present on hit line 20 and fix line 34, a logic one will be output from AND gate 58. In turn, assuming that the stored state in the memory element is a logic zero, the output of NOR gate 44 will change from a logic one to a logic zero, due to the application of a logic one to the input of NOR gate 44 from the output of AND gate 58. This, in turn, will cause the stored logic state in the memory element to change from a logic zero to a logic one. Thus, the structure of the alternative content addressable memory cell 14 permits one to use the logic state on the hit line 20 to change the state stored in the memory cell by merely pulsing fix line 34.

In the structure illustrated, the logic state of the memory element can be changed from a logic zero to a logic one. It is to be understood that other alterations of the data can be obtained by modifying the logical relationship of AND gate 54 and NOR gate 44. For example, by inverting the logic state received by AND gate 58 from hit line 20, the logic state stored in the memory element will be changed when the hit line has been previously discharged. Alternatively, if inverter 40, were replaced by a NOR gate, one input of which was supplied from AND gate 58 and the other of which was supplied from an inverter connected to node 50, the content of the memory element could be changed from a logic one to a logic zero.

The alternative content addressable memory cell 14 as described finds application in a number of areas. In the application shown in FIG. 1, the alternative content addressable memory cell 14 is associated with each of the rows in a content addressable memory structure to provide a specific subclass of the overall function of the content addressable memory. The cell can be used as a hard mask cell which is set to indicate whether or not the entry in a particular row was created for a write.

The advance gained by using the alternative content addressable memory cell 14 is that it can be selected by any hit line that is left undischarged after the whole content addressable memory structure has been accessed. Thus it can be selected not only by the normal cam addressing mechanism but also by the comparison access method.

Content Addressable Memory Cell 10

Referring now to the bottom right-hand corner of FIG. 1, the content addressable memory cell 10 of the present invention will be described in greater detail. Cross coupled transistors 60 and 62 are employed as the memory element in the form of a standard static RAM cell.

The drains of both transistors 60 and 62 are coupled to signal common, while the gate terminal of transistor 62 is coupled to the source terminal of transistor 60, and the gate terminal of transistor 60 is coupled to the source terminal of transistor 62. Transistors 64 and 66 provide loads to the source terminals of transistors 60 and 62, respectively. The gate terminal and drain terminal of transistor 64 are coupled to the source terminal of transistor 60 while the source terminal of transistor 64 is coupled to the voltage supply for the device. Similarly, the source terminal for transistor 66 is coupled to the voltage supply. The gate terminal and drain terminal of transistor 66 are coupled to the source terminal of transistor 62. The logic state present on the source terminal of transistor 62 represents the logic state stored in the memory element.

In operation, the logic state of the source terminal of transistor 62 maintains the gate terminal of transistor 60 in a appropriate logic state such that the source terminal of transistor 60 will supply a logic state to the gate terminal of transistor 62 so as to maintain the source terminal of 62 in the desired logic state. For example, if the source terminal of transistor 62 is in a logic one state, this means that the gate terminal of transistor 62 is being held at a logic zero state. The logic one state of the source terminal of transistor 62 causes a logic one state to be applied to the gate terminal of transistor 60. In turn, this causes the source terminal of transistor 60 to be held at a logic zero condition, and hence the gate terminal of transistor 62 to be held in an off condition. Conversely, if the source terminal of transistor 62 is at a logic zero state, transistor 62 will be in an on condition, and the gate terminal thereof should be at a logic one state. The logic state on the source terminal of transistor 62 is applied to the gate terminal of transistor 60. This zero logic state causes transistor 62 to be kept off, thereby permitting transistor 64 to raise the gate terminal for transistor 62 to a logic one state and hence to turn transistor 62 on.

The stored logic state in the memory element of content addressable memory cell 10 is modified by way of transistors 68 and 70. The gate terminals of transistor 68 and 70 are coupled to row select line 22. The source terminal of transistor 68 is connected to the noninverted data line 24, while the source terminal of transistor 70 is coupled to the inverted data line 26. The drain terminal of transistor 68 is coupled to the gate terminal of transistor 60 while the drain terminal of transistor 70 is coupled to the gate terminal of transistor 62.

As was discussed above, the self-blocking driver circuit 12 supplies complementary data to the content addressable memory cell 10 on lines 24 and 26. Thus, when a logic one is applied to line 24, a logic zero will be applied to line 26, and vice versa.

When row select line 22 is asserted, transistors 68 and 70 will couple the logic states present on lines 24 and 26, respectively, to the associated gate terminals of transistors 60 and 62. In turn, this causes the desired logic state to be written into the memory element. For example, assuming that a logic zero state is being stored in the memory element, and a logic one state is present on noninverted data line 24. This indicates that a logic zero state will be present on inverted data line 26. When the row select line 22 is asserted, the logic one state from noninverted data line 24 is coupled through transistor 68 to the gate terminal of transistor 60. This causes transistor 60 to be turned on, thus bringing the gate terminal of transistor 62 to a logic zero level. Additionally, the logic zero level present on inverted data line 26 will be coupled to the gate terminal of transistor 62 to force transistor 62 into an off condition. When transistors 68 and 70 are turned off, by the removal of the row select signal on row select line 22, the memory element will maintain the logic one state. The content addressable memory function of content addressable memory cell 10 is achieved by way of transistors 72, 74 and 76.

The source terminal of transistor 76 is coupled to hit line 20, while the drain terminal thereof is coupled to the signal common. The gate terminal for transistor 76 is coupled to the drain terminals of transistors 72 and 74. The source terminal of transistor 72 is coupled to the noninverted data line 24, while the source terminal for transistor 74 is coupled to the inverted data line 26. The gate terminal of transistor 72 is controlled by the source terminal of transistor 60, while the gate terminal of transistor 74 is controlled by the source terminal of transistor 62.

The above structure provides a comparison function as follows. The gate terminals of transistor 72 and 74 are utilized to determine the logic state stored in the memory element. If a logic one is stored in the memory element, transistor 72 is turned off while transistor 74 is turned on. Thus, the logic state from inverter data line 26 is coupled to the gate terminal of transistor 76. In turn, when a logic zero state is stored in the memory element, transistor 74 is off and transistor 72 is on. Thus, the logic state present on noninverted data line 24 is coupled to the gate terminal of transistor 76. As such, transistor 76 will pull hit line 20 down when there is a mismatch between the logic state stored in the memory element and the data being applied to the content addressable memory cell 10.

Thus, where a logic one state is stored in the memory element, and a logic one state is being applied to the content addressable memory cell 10, the inverted data line 26 will be at a logic zero state. This logic zero state is then coupled via transistor 74 to the gate terminal of transistor 76, causing transistor 76 to be turned off. The hit line 20 will therefore remain unchanged. If, on the other hand, the data being applied by self-blocking driver circuit 12 to content addressable memory cell 10 was a logic zero, inverted data line 26 will be at a logic one state. This logic one state will be coupled via transistor 74 to the gate terminal of transistor 76, thereby turning transistor 76 on and causing hit line 20 to be discharged to the signal common.

Conversely, if the logic state stored in the memory element is a logic zero, and the logic state being applied by self-blocking driver 12 is a logic one, a logic one state will be present on noninverted data line 24. This logic one state will be applied via transistor 72 to the gate terminal of transistor 76, thereby causing transistor 76 to discharge hit line 20 to the signal common. On the other hand, if a logic zero is being applied by self-blocking driver circuit 12 to content addressable memory cell 10, a logic zero state will be present on noninverted data line 24. This logic zero state will be applied via transistor 72 to the gate terminal of transistor 76. This will cause transistor 76 to be turned off, thereby preventing transistor 76 from discharging hit line 20.

The operation of transistors 72 and 74 can be viewed as a multiplexer 69 having input lines 73 and 75, an output 71, and select lines 77 and 79. As can be seen from FIG. 1, complementary data-in lines 24 and 26 are connected to the input lines 73 and 75, respectively, and the output 71 supplies the control signal to transistor 76. The logic state of the previously stored data in the cell is supplied to the select lines 77 and 79.

The structure described above provides a simple and fast content addressable memory cell capability. In conventional content addressable memory cells, a pair of transistor stacks is typically associated with the comparison function. Each of the stacks includes two transistors, one controlled by the state of its associated inverted or noninverted data line, and the other being controlled by an associated state of the memory element. Each stack could independently discharge hit line 20. The problem with such an arrangement is that of the physical area required for the two pairs of transistors, as well as a high impedance to ground through each of the pairs. In contrast, the present invention utilizes a single transistor to drive the hit line 20 to ground. This provides a much lower impedance to ground, as well as requires a smaller physical area.

Self-Blocking Driver

Referring to the upper right-hand corner of FIG. 1, the self-blocking driver circuit of the present invention will now be described in greater detail. As discussed above, in dynamic structures, a precharging step is used to place the dynamic structure into a predetermined condition prior to the application of data to it. The precharging typically occurs during one portion of a clock cycle, such as when the clock is in a logic zero condition. During the logic one portion of the clock cycle, valid data is applied to the dynamic structure and the dynamic structure responds thereto. In the past, precharge block structures have been employed which were responsive to the data input and the clock signal. These precharge block structures employed virtual ground nodes to implement the blocking function. As described above, these virtual ground nodes and accompanying large blocking transistors suffer from slow speeds and large physical area requirements. In accordance with the present invention, a structure is provided which does away with the requirement for a virtual ground node while providing the blocking function, and also provides faster response with a smaller physical area requirement.

Generally, self-blocking driver circuit 12 responds to the signal on clock line 30 to cause the signals applied to noninverted data line 24 and inverter data line 26 to be maintained at a predetermined logic level while the clock signal on clock signal line 30 is in a first predetermined logic state. Thereafter, when the signal on clock line 30 changes state, the self-blocking driver circuit 12 permits a response from only the data line output which is to change.

For example, if a logic zero is applied on data input line 28, this means that during the second predetermined state of the clock signal the logic state of inverted data line 26 should be a logic one. Note also that the logic state of noninverted data line 24 will remain at a logic zero state. The operation of self-blocking driver circuit 12 is such that only the circuitry associated with the driving of inverted data line 26 will be permitted to respond, while the circuitry associated with driving noninverted data line 24 will be disabled.

The above function is obtained by providing circuitry which is responsive to the logic state on data input line 28 so as to determine which portion of the driver should be responsive and which portion should not, and to thereafter disable the nonresponsive portion of the driver.

More specifically, the self-blocking driver circuit 12 provides a driver section 78 for driving the noninverted data line 24, and a driver section 80 for driving the inverted data line 26. The input to driver section 78 is supplied via transistor 82 and the input to driver section 80 is supplied through transistor 84. It is to be noted that the input to each of the driver sections is supplied from the clock signal on line 30. The data signal on data input line 28 is utilized to enable or disable the driver sections 78 and 80.

This control function is achieved as follows. For each of the driver sections, an open collector inverter is provided which, when activated, forces the input to the associated driver section to the signal common potential. Open collector inverter 86 provides this function to driver section 78 while open collector inverter 88 provides the function to driver section 80. Further, the operation of transistors 82 and 84 are controlled by the logic state present on data input line 28. More specifically, data input line 28 is coupled to the gate terminal of transistor 82 and to the input of open collector inverter 88. Similarly, the inverse of the logic state on data input line 28 is coupled, via inverter 90, to the gate terminal of transistor 84 and to the input of open collector inverter 86. Thus, when the logic state on data input line 28 is a logic one, transistor 82 will be on to couple the clock signal to driver section 78. In turn, open collector inverter 88 will force the input to driver section 80 to the signal common potential, thereby disabling driver section 80, and thus forcing driver section 80 to a logic zero level. Further, while the clock signal on clock line 30 is at a logic zero level, the logic state applied through transistor 82 will be a logic zero, thus causing the logic state output from driver section 78 to be a logic zero state. When the clock signal on clock line 30 changes to a logic one state, the logic one state is passed via transistor 82 to driver section 78 and then to the output of driver section 78. In the meantime, the logic one state on data input line 28 is inverted by inverter 90 and applied to turn transistor 84 off and to place open collector inverter 86 into a high impedance condition. This high impedance condition permits the signal passing through transistor 82 to drive driver section 78.

Conversely, when the logic state on data input line 28 is a logic zero, gate 82 will be off and open collector inverter 88 will be placed in a high impedance state. Further, inverter 90 will apply a logic one state to turn on transistor 84, and to cause open collector inverter 86 to force driver section 78 into a logic zero state. Initially, when the clock signal is in a logic zero state, such logic zero state will be passed to driver section 80 to cause a logic zero to be applied to the inverted data line 26. When the clock signal assumes a logic one state, this logic one state is passed via transistor 84 to driver section 80 to cause the output of driver section 80 to attain a logic one state.

It is to be noted that during all of this time, the particular driver section which has been disabled by its associated open collector inverter remains unresponsive to whatever is happening on the clock line 30. Thus, what is obtained, is a self-blocking driver which provides a benign output to the attached dynamic structure, such as content addressable memory cell 10, during the precharging portion of the clock cycle, i.e., the logic zero portion thereof. Thereafter, only that driver section of the self-blocking driver which needs to change actually does change when the clock cycle assumes a logic one condition. The other driver section remains unchanged and unresponsive to any changes in the clock signal.

Each of the driver sections 78 and 80 includes a stacked pair of transistors coupled between the voltage supply and signal common, and driven by a complementary data input. Inverters 92 and 94 provide this complimentary data input. The above can be seen more clearly in FIG. 2. For the driver section 80, a soft enhancement transistor 96 is paired with a transistor 98. The source terminal of transistor 96 is coupled to the voltage supply, the gate terminal is coupled to receive the clock signal from transistor 84, and the drain terminal is coupled to the source terminal of transistor 98 and to inverted data line 26. The gate terminal of transistor 98 is coupled to the output inverter 94, while the drain terminal of transistor 98 is coupled to signal common. The input to inverter 94 is coupled to the source terminal of open collector inverter 88 and to transistor 84. In this manner, when a logic one is present from transistor 84, transistor 96 is on and transistor 98 is off so that a logic one is presented to inverter data line 26. Conversely, when a logic zero state is presented from transistor 84, transistor 96 will be off and transistor 98 will be on to provide a logic zero state to inverter data line 26. The driver section 78 operates in a similar manner.

Referring to FIG. 3, a logical representation of the structure of self-blocking driver circuit 12 is shown. There, AND gate 100 receives the clock signal on clock line 30, and the data signal on data in line 28, at its inputs, and provides an output which is the logical AND of the clock signal and the data input signal. Further, AND gate 102 receives at its inputs the clock signal on clock line 30, and the inverted data signal via data input line 28, to provide a logical AND of the clock signal and the inverted data input signal.

FIG. 4 is an alternative logical representation of the self-blocking driver circuit 12. NOR gate 104 receives at its inputs the inverted clock signal from line 30 and inverter 106, and the inverted data input signal via line 28 and inverter 108. The output of NOR gate 24 is the logical NOR of the inverted clock input and the inverted data input. NOR gate 110 provides the logical NOR of the inverted clock signal and the data signal.

It is to be understood that the structures described herein are especially suited for implementation as metal oxide semiconductor devices. FIG. 4 provides the logical structure in the form of which a self-blocking driver can be implemented by way of MOS technology.

The terms and expressions which have been employed here are used as terms of description and not of limitations, and there is no intention, in the use of such terms and expressions of excluding equivalents of the features shown and described, or portions thereof, it being recognized that various modifications are possible within the scope of the invention claimed.

I claim:

1. An improved content addressable memory cell for storing data and responsive to data applied to complementary data-in lines, wherein the applied data in an uncomplemented form is carried on an uncomplemented data line, and the applied data in complemented form is carried on a complemented data line, so that the complemented data line has a logic state which is the complement of the logic states on the complemented data line, wherein the improved content addressable memory cell compares the applied data to data which has been previously stored therein and provides an indication on a hit line of whether the applied data matches the previously stored data, the improvement comprising
    transistor means responsive to a control signal and coupled to the hit line for placing the hit line in a predetermined logic state in response to the control signal; and
    means responsive to the logic state of the previously stored data for selectively supplying the logic state from one of the complementary data-in lines as the control signal to the transistor means, wherein the logic state on the complemented data-in line is selected and supplied as the control signal when the previously stored data has a logic one state, and the logic state on the uncomplemented data-in line is selected and supplied as the control signal when the previously stored data has a logic zero state, so that the hit line is placed in the predetermined logic state when there is a mismatch between the applied data and the previously stored data.

2. The improved content addressable memory cell of claim 1 wherein the supplying means comprise first and second transistors, wherein the first transistor is associated with the complemented data-in line and couples the logic state thereon as the control signal to the transistor means when the logic state of the previously stored data is a logic one, and the second transistor is associated with the uncomplemented data-in line and couples the logic state thereon as the control signal to the transistor means when the logic state of the previously stored data is a logic zero.

3. The improved content addressable memory cell of claim 1 wherein said supplying means is a multiplexer means having input lines, an output, and select lines, and further wherein each of the complementary data-in lines are connected to a different one of the input lines of the multiplexer means, the output line supplies the control signal to the transistor mean, and the logic state of the previously stored data is supplied to the select lines.

4. A content addressable memory cell which is responsive to a data signal and a complemented data signal supplied on data input lines, and providing for the removal of a hit signal from a hit line when the applied data does not match data which has been previously stored in the content addressable memory cell, wherein the hit signal is prechanged onto the hit line, comprising a memory cell for storing a logic state, said memory cell providing the logic state on a first terminal and a complement of the logic state on a second terminal;

hit transistor means coupled to the hit line controllably removing the hit signal from the hit line;

first coupling transistor means for controllably coupling the logic state present on one of the data-in lines to the hit transistor so as to control the operation of the hit transistor, wherein said first coupling transistor means is controlled by the logic state on the second terminal of the memory cell; and second coupling transistor means for controllably coupling the logic state present on the other of the data-in lines to the hit transistor so as to control the operation of the hit transistor, wherein said second coupling transistor means is controlled by the logic state on the first terminal of the memory cell, so that only one of the first and second coupling transistors is operative at a time.

5. The improved content addressable memory cell of claim 1 wherein the previously stored data is stored by way of first and second cross coupled transistors, each having a control terminal, a drain terminal, and a source terminal, and first and second means for providing a current source, wherein the gate of the first cross coupled transistor is connected to the source terminal of the second cross coupled transistor and the first current source means, the gate of the second cross coupled transistor is connected to the source terminal of the first cross coupled transistor and the second current source means, and the drains of the first and second cross coupled transistors are held at the same potential, so that the logic state of the previously stored data is represented by the potential of the source terminal of the second cross coupled transistor.

6. The improved content addressable memory cell of claim 5 further responsive to an enable signal and including first and second enable transistors, each having a drain terminal, a source terminal, and a gate terminal wherein the drain of the first enable transistor is connected to the gate terminal of the first cross coupled transistor, the gate terminal of the first enable transistor is connected to be responsive to the enable signal, and the source terminal of the first enable transistor is connected to one of the complementary data-in lines; and further wherein the drain terminal of the second enable transistor is connected to the gate terminal of the second cross coupled transistor, the gate terminal of the second enable transistor is connected to be responsive to the enable signal, and the source terminal of the second enable transistor is connected to the other of the complementary data-in lines;

so that each of the first and second enable transistors couples the logic state present on its associated complementary data-in lines to the gate terminal of its associated cross coupled transistor when the enable signal is asserted.

7. An improved content addressable memory cell responsive to a write enable signal and to data on a write data line to store said data in a memory element and to compare data applied on a compare data line with the stored data, so as to provide a logic state on a hit line which is indicative of a mismatch between the applied data and the stored data, the improvement comprising means responsive to a fix data signal and to the logic state being applied on the hit line, for setting the memory cell to a first predetermined logic state when the logic state on the hit line is a second predetermined logic state, so that the contents of said memory cell can be changed without requiring the write enable signal and the presence of data on the write data line, and wherein the memory element includes a feedback path having a logic state which maintains the stored logic state in the memory element, and further wherein the setting means include means for altering the logic state on the feedback path to the first predetermined logic state when the logic state on the hit line is the second predetermined logic state and the fix data signal is present.

8. The improved convent addressable memory of claim 7 wherein the write data is supplied from a source having a predetermined source impedance, and further wherein the memory element and the altering means together comprise logic means having a first input coupled to receive the fix data signal, a second input coupled to the hit line, and a third input coupled to receive data on the write data line for providing an output having the same logic state as that present at the third input of the logic means, and for setting the output of the logic means to the first predetermined logic state when the hit line is in the second predetermined logic state and the fix data signal is present;

wherein the third input is connected to the output, by way of the feedback path, and to receive the write data; and further wherein the feedback path includes means for providing an impedance rise from the output of the logic means to the third input of the logic means, which impedance write data source.

9. The improved content addressable memory of claim 7 wherein the memory element and altering means together comprise inverter means having an input and an output for providing at its output the complement of the logic state applied at its input;

load means coupled at one end to the output of the inverter means for providing a load thereto; and NOR gate means having at least first and second inputs and an output for providing at its output the logical NOR of the logic states applied to its inputs, wherein the first input of the NOR gate means is coupled to the other end of the load means, and the output of the NOR gate means is coupled to the input of the inverter means, so that the logic state of the stored data corresponds to the logic state at the first input to the NOR gate means.

10. The improved content addressable memory cell of claim 9 wherein the setting means further include AND gate means having at least first and second inputs and an output for providing an output which is the logical AND of its inputs, and further wherein the first input of the AND gate means is coupled to the hit line, the second input of the AND gate means is coupled to receive the fix data signal and the output of the AND gate means is coupled to the second input of the NOR gate means.

11. The improved content addressable memory of claim 9 further including complementary driver means having a complemented input, an uncomplemented input, and an output, and responsive to logic states on the compare data line for placing the hit line into a third predetermined logic state when the logic state of the compare data line is different from the stored data, wherein the uncomplemented inputs coupled to the output of the NOR gate means, the complemented input is coupled to the output of the inverter means, and the output of the complementary driver is coupled to the hit line.

12. The improved content addressable memory of claim 11 wherein the complementary driver means comprise first, second and third transistors each having gate, drain, and source terminals, and further wherein the source terminal, the gate and the drain terminal of the first transistor are coupled to the compare data line, the output of the NOR gate means, and the source terminal of the second transistor, respectively, wherein the source terminal, the gate terminal, and the drain terminal of the second transistor are coupled to the gate terminal of the third transistor, the output of the inverter means, and a signal common, respectively, and wherein the source terminal and the drain terminal of the third transistor are coupled to the hit line and the signal common, respectively.

13. The improved content addressable memory of claim 9 further including gating means responsive to the write enable signal for coupling the logic state present on the write data line to the first input of the NOR gate means so that the logic state on the write data line is written into the memory element when the write enable signal is asserted.

* * * * *